United States Patent [19]
Atarius et al.

[11] Patent Number: 6,104,767
[45] Date of Patent: Aug. 15, 2000

[54] METHOD AND APPARATUS FOR ESTIMATING A FREQUENCY OFFSET

[75] Inventors: Roozbeh Atarius, Lund, Sweden; Georg Frank, Nürnberg, Germany

[73] Assignee: Telefonaktiebolaget LM Ericsson, Stockholm, Sweden

[21] Appl. No.: 08/971,666

[22] Filed: Nov. 17, 1997

[51] Int. Cl.$^7$ .................................................. H04L 27/06
[52] U.S. Cl. ........................ 375/344; 375/354; 375/362
[58] Field of Search .................................. 375/283, 326, 375/339, 354, 362; 327/17, 45, 48; 329/304, 306, 345, 346

[56] References Cited

U.S. PATENT DOCUMENTS

| | | |
|---|---|---|
| 4,447,910 | 5/1984 | Smith et al. . |
| 4,661,769 | 4/1987 | Girgis . |
| 4,847,872 | 7/1989 | Hespelt et al. . |
| 4,849,991 | 7/1989 | Arnold et al. . |
| 4,941,155 | 7/1990 | Chuang et al. . |
| 4,983,906 | 1/1991 | Hiller . |
| 5,257,291 | 10/1993 | Desperben et al. . |
| 5,295,153 | 3/1994 | Gudmundson . |
| 5,299,235 | 3/1994 | Larsson et al. . |
| 5,315,307 | 5/1994 | Tsui et al. . |
| 5,329,588 | 7/1994 | Larsson et al. . |
| 5,363,414 | 11/1994 | Muto . |
| 5,416,800 | 5/1995 | Frank . |
| 5,425,058 | 6/1995 | Mui . |
| 5,440,267 | 8/1995 | Tsuda et al. . |
| 5,452,320 | 9/1995 | Kim et al. ............................ 375/224 |
| 5,473,637 | 12/1995 | Gardner ............................... 375/329 |
| 5,491,724 | 2/1996 | Altes . |
| 5,497,400 | 3/1996 | Carson et al. ....................... 375/324 |
| 5,504,786 | 4/1996 | Gardner . |
| 5,519,399 | 5/1996 | Greene et al. . |
| 5,519,625 | 5/1996 | Chu . |
| 5,535,249 | 7/1996 | Miyashita ............................. 375/344 |
| 5,581,582 | 12/1996 | Choi ..................................... 375/344 |
| 5,588,026 | 12/1996 | Ishikawa et al. ..................... 375/329 |
| 5,638,406 | 6/1997 | Sogabe ................................. 375/326 |
| 5,838,737 | 11/1998 | Yamaguchi et al. ................. 375/331 |

FOREIGN PATENT DOCUMENTS

| | | |
|---|---|---|
| 95/28771 | 10/1995 | WIPO . |
| 96/19056 | 6/1996 | WIPO . |

OTHER PUBLICATIONS

European Digital Cellular Telecommunications Systems (Phase 2); Radio Transmission and Reception (GSM 05.05), 4th Edition, Aug. 1995.

Tretter, S.A., "Estimating the Frequency of Noisy Sinusoid By Linear Regression", IEEE, Transactions on Information Theory, vol. IT–31, No. 6, pp. 832–835, Nov. 1985.

*Primary Examiner*—Stephen Chin
*Assistant Examiner*—Dac V. Ha
*Attorney, Agent, or Firm*—Burns, Doane, Swecker & Mathis, L.L.P.

[57] ABSTRACT

In a communication system including at least one transmitter and at least one receiver, a frequency offset between a carrier frequency of the transmitter and a local frequency reference of the receiver is estimated. A phase difference is computed between successively collected samples of a frequency synchronization signal transmitted by the transmitter and detected by the receiver. The phase difference is added to accumulated phase differences. Phase differences of successively collected samples are computed and added to accumulated phase differences until M accumulated phase differences have been added. The sum of the M phase differences is dumped, resulting in zero accumulated phase differences. Phase differences of successively collected samples are computed, the phase differences are added to accumulated phase differences, and the sum of M phase differences is dumped until N sums of M phase differences have been dumped. The N sums of the M phase differences are added to produce the estimated frequency offset.

24 Claims, 12 Drawing Sheets

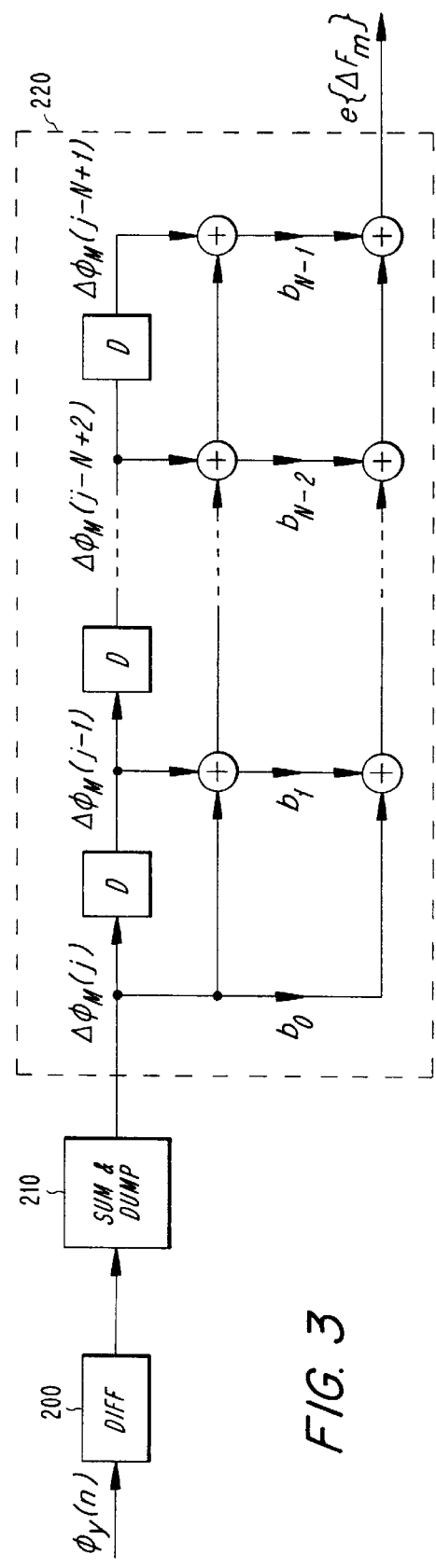
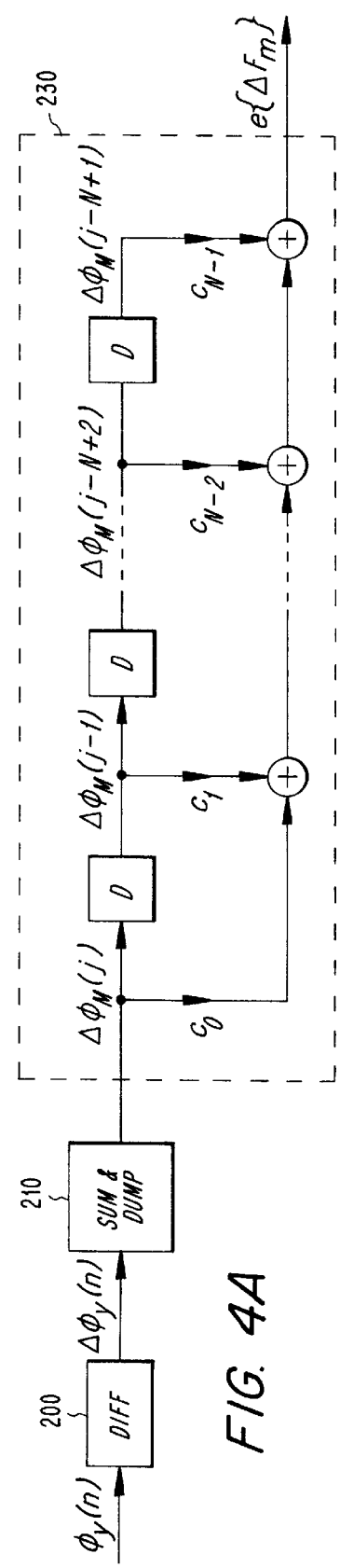
FIG. 3
FIG. 4A

METHOD AND APPARATUS FOR ESTIMATING A FREQUENCY OFFSET

BACKGROUND

This invention relates generally to a method and apparatus for estimating a frequency offset. More particularly, this invention relates to a method and apparatus for estimating the frequency offset between a carrier frequency of a transmitter and a local frequency reference of a receiver in a communication system.

In any communication system, it is important for a receiver to be synchronized with a transmitter so that messages can be successfully exchanged between the transmitter and the receiver. In a radio communication system, in particular, it is important that a receiver be tuned to the frequency of the transmitter for optimal reception.

In a typical radio communication system, remote stations communicate with one or more base stations via a radio air interface. Various approaches have been employed to prevent transmissions between the various base stations and remote stations from interfering with each other.

In some radio communication systems, neighboring base stations are each assigned a different carrier frequency with which to communicate with remote stations so that transmissions from one base station do not interfere with transmissions from a neighboring base station. In addition, to prevent transmissions between each of the remote stations and a particular base station from interfering with each other, Frequency Division Multiple Access (FDMA) and Time Division Multiple Access (TDMA) have been employed. In radio communication systems using FDMA, each remote station is assigned a particular frequency with which to communicate with a base station. In systems using TDMA, a base station allocates a particular time slot or slots within a frame to each remote station. Some remote stations can use the same frequency but different time slots to communicate with the base station.

In other radio communication systems, the Code Division Multiple Access (CDMA) method has been employed. According to the CDMA method, each remote station is assigned a particular digital code word(s) that is orthogonal to code words assigned to other stations. Neighboring base stations can exchange messages with remote stations using the same frequency but different digital orthogonal code words to indicate which remote station the messages are designated for.

Whether a radio communication system employs FDMA, TDMA, CDMA, a combination of these approaches, or some other approach, it is important for a remote station to be time and frequency synchronized to the base station serving the area from which it desires to communicate. In other words, the local frequency reference of the remote station must be tuned to the carrier frequency of the base station, and the local time reference of the remote station must be synchronized to the time reference of the base station. A periodic synchronization signal is typically transmitted from the base station to the remote station for this purpose.

For initial synchronization in a system employing the European Global System for Mobile Communication (GSM) standard, the carrier frequency of the base station is modulated from time to time with a Frequency Correction Burst (FCB) and a Synchronization Burst (SB) to form a frequency synchronization signal. The carrier frequency of the base station is typically modulated with the FCB using Gaussian Minimum Shift Keying (GMSK). A typical FCB is a sequence of 148 symbols, each symbol a zero, that transforms into a pure sinusoidal signal after modulation. The frequency of the resulting frequency synchronization signal is thus equal to $1/4T$ Hz, where T represents a symbol duration of the sinusoidal signal, and there are four symbols per cycle of the sinusoidal signal. T is typically 48/13 microseconds ($\mu$sec), so that the frequency synchronization signal has a frequency of approximately 67.7 KHz. The FCB is repeated every tenth frame for the first four times, and then for the fifth time, the FCB is repeated on the eleventh frame. This frame sequence is then repeated indefinitely, to maintain synchronization between the remote station and the base station.

From the information in the FCB, the remote station is able to roughly synchronize itself with the time slot(s) allocated to it. This rough time synchronization is then sufficient to locate the SB, which is typically located eight bursts after the FCB, and to decode the information it carries. The information obtained by decoding the SB is then used to finely tune the local frequency reference of the remote station to the carrier frequency of the base station and to adjust the remote station's local time reference to the time slot(s) allocated to it by the base station.

In systems employing CDMA, each base station transmits a frequency synchronization signal in the form of, for example, a pilot sequence on each of the frequencies assigned to that particular base station as well as possibly on some or all of the frequencies that are not assigned to that particular base station. If the frequency has been assigned to the base station, the corresponding pilot sequence may be transmitted with slightly more power than the other frequencies used by the base station. Each remote station receiving the carrier modulated by the pilot sequence demodulates the signal. As a result, each remote station can receive signals designated for it and simultaneously measure the signal strengths of neighboring base stations using different carriers. This information is used by the remote station to determine which received pilot sequence has the strongest signal strength, and the local frequency reference of the remote station is adjusted to the appropriate carrier frequency, accordingly.

Any frequency difference between the local frequency reference of the remote station and the carrier frequency of the base station is readily detected in the demodulated frequency synchronization signal. For example, in systems employing the GSM standard, the difference between the frequency of the modulated frequency synchronization signal, which is known to be 67.7 KHz, and the frequency of the received frequency synchronization signal, demodulated to the baseband, is a direct measure of the error in the local frequency reference of the remote station. In systems employing CDMA, the difference between the known frequency of the strongest transmitted pilot sequence and the frequency of the demodulated pilot sequence is used by the remote station as a measure of the error in the local frequency reference of the remote station.

A number of approaches have been introduced for estimating the frequency difference between the remote station's local frequency reference and the carrier frequency of the base station, taking into account phase variations that may occur in the transmitted frequency synchronization signal due to modulation. From this estimated frequency difference, the carrier frequency of the base station can be derived.

For example, U.S. Pat. No. 4,847,872 to Hespelt et al. discloses a method and arrangement for synchronizing receivers in digital transmission systems. A preamble pattern is transmitted and demodulated such that the received signal has a cosine shape. The frequency and/or phase of the carrier are estimated, and individual spectral lines of the received signal are obtained by filtering. The frequencies and phases associated with the spectral lines are determined by linear regression, and the carrier frequency offset is estimated based on these values.

U.S. Pat. No. 5,416,800 to Frank discloses a mobile radio receiver for a radio transmission system including a recognition circuit which detects pulses of a frequency synchronization signal including a FCB and derives a time position signal from the detected pulses using linear regression. The radio receiver also includes a frequency estimating circuit which estimates a frequency deviation based on the received signal. The time position signal and the frequency deviation signal are used to track the frequency of the carrier wave. According to this patent, the entire FCB is used to estimate the frequency deviation.

The approaches described in these two patents suffer from the same problem, namely, that the number of samples and the corresponding number of computations used to estimate the frequency offset consume a significant amount of memory. To simplify computation, these patents disclose "phase unwrapping", i.e., limiting the range of phase variation in the received signal to ±π. If the phase difference between successive samples is outside of the interval (−π, π), the most recently collected sample is "unwrapped", i.e., phase shifted by −2π or 2π, and this phase shift is tracked, e.g., stored in a memory in association with the corresponding sample. This consumes even more memory and results in a complex system.

Due to their large memory requirements, the approaches disclosed in these patents are typically implemented in software. This consumes large amounts of power. Since time synchronization must be performed when a remote station is in the idle stand-by mode, and remote stations are often battery powered, power consumption is an important consideration. The higher the power consumption, the lower the available stand-by time.

There is, thus, a need for a simple method for estimating a frequency offset which consumes a minimal amount of power and memory and which overcomes the drawbacks noted above.

SUMMARY

It is therefore an object of the present invention to provide a method and apparatus for estimating a frequency offset which consumes a minimal amount of power and memory. It is yet another object of the present invention to provide a method and apparatus for estimating a frequency offset which can be implemented in hardware.

According to an exemplary embodiment of the present invention, a method and apparatus are provided for estimating a frequency offset between a carrier frequency of a transmitter and a local frequency reference of a receiver in a communication system. Successive samples of a frequency synchronization signal transmitted by the transmitter and detected by the receiver are collected, and a phase difference is computed between the successively collected samples. The signal received by the receiver can be prefiltered to improve detection. The phase difference is added to accumulated phase differences. Phase differences of successively collected samples are computed and added to accumulated phase differences until M accumulated phase differences have been added. The sum of the M phase differences is dumped, resulting in zero accumulated phase differences. Phase differences of successively collected samples are computed, the phase differences are added to accumulated phase differences, and the sum of M phase differences is dumped until N sums of M phase differences have been dumped. The N sums of M phase differences are each weighted, and the weighted N sums are added to produce the estimated frequency offset. In this manner, phase variations in the detected frequency synchronization signal are compensated for, i.e., phase unwrapping is achieved, without requiring a memory to keep track of phase shifts. To determine the accuracy of the estimated frequency offset, a quality factor can be estimated.

BRIEF DESCRIPTION OF THE DRAWINGS

The features, objects, and advantages of the invention will become apparent by reading this description in conjunction with the accompanying drawings, in which like reference numerals refer to like elements and in which:

FIG. 3 illustrates an exemplary apparatus for estimating a frequency offset using modified linear regression according to a first embodiment of the present invention;

FIG. 4A illustrates an exemplary apparatus for estimating a frequency offset using modified linear regression according to a second embodiment of the present invention;

DETAILED DESCRIPTION

For illustrative purposes, the following description is directed to a radio communication system employing the GSM standard. It will be understood that this invention is not so limited but applies to other types of communication systems employing different standards.

Figure 1:
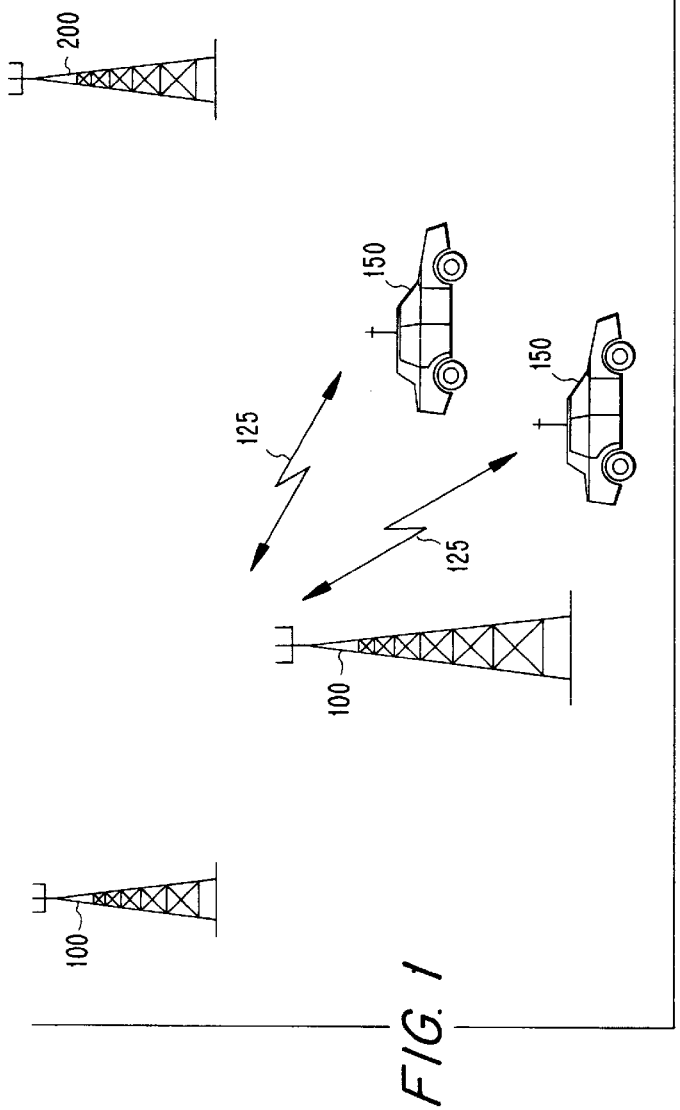
FIG. 1 illustrates an exemplary communication system in which the present invention can be implemented.

FIG. 1 illustrates an exemplary communication system in which the present invention can be implemented. The system includes at least one transmitter 100 and at least one receiver 150. Although the transmitter 100 and the receiver 150 are depicted in FIG. 1 as a base station and a mobile station, respectively, it will be appreciated that the transmitter can be implemented in many ways, e.g., as a terrestrial or satellite repeater, and the receiver can be implemented in many ways, e.g., as a fixed cellular terminal (wireless local loop). A base station and a mobile station are depicted in FIG. 1 and described in the following for illustrative purposes only.

The base station 100 and the mobile station 150 communicate via a radio air interface 125. Each neighboring base station 100 is assigned a particular carrier frequency, and each base station 100 allocates specific time slots for each mobile station 150.

To communicate with a base station 100, a mobile station 150 must be time and frequency synchronized to the base station 100. In other words, the local frequency reference and time reference of the mobile station 150 must be synchronized with the carrier frequency assigned to the base station 100 and the time slot(s) allocated by the base station, respectively. In a CDMA system, the mobile station 150 must be synchronized with the base station's carrier frequency and the code words transmitted.

To synchronize the mobile station 150, the base station 100 transmits a frequency synchronization signal to the mobile station. For example, in systems employing the GSM standard, the base station 100 modulates its carrier frequency with a FCB to form a frequency synchronization signal.

The modulated frequency synchronization signal $x_c(t)$ can be represented as:

$$x_c(t) = \sqrt{P} \cos(\Omega_c t + \phi_c(t) + \theta), \quad (1)$$

where $\sqrt{P}$, $\Omega_c t$, $\phi_c(t)$, and $\theta$ denote the carrier amplitude, the carrier frequency, the carrier phase, and an initial phase, respectively, at time t.

The mobile station 150 receives and demodulates the transmitted frequency synchronization signal $x_c(t)$ in any suitable manner. For example, the frequency synchronization signal can be detected in the manner described in the copending U.S. patent application entitled "Method and Apparatus for Detecting a Frequency Correction Burst", filed on the same date as this application, in the names of Roozbeh Atarius and Kjell Gustafsson, and incorporated here by reference. The detected frequency synchronization signal in the baseband can be represented as a complex-valued sampled signal x(n):

$$x(n) = \sqrt{P} \exp\{j\phi_x(n) + \theta)\} \forall n \in \Psi \quad (2)$$

where $\phi_x(n)$ represents the phase of the baseband signal x(n), and $\Psi$ refers to the set of discrete time indices corresponding to the FCB, $n_0, n_0+1, \ldots n_0+N_0-1$, and $N_0$ represents the total number of samples in the FCB.

For an FCB, the carrier phase $\phi_c(t)$ can be written as $$\frac{\pi}{2T_s}t$$

where $T_s$ represents the symbol duration, approximately 48/13 µs. Substituting for $\phi_x(n)$ and sampling at a rate $F_s=1/T_s$ or 270.833 KHz, Equation 2 can be rewritten as:

$$x(n) = \sqrt{P} \exp\left\{j\left(\frac{\pi}{2}n + \theta\right)\right\} \quad \forall n \in \Psi \quad (3)$$

Any frequency offset $\Delta F$ between the local frequency reference of the mobile station and the carrier frequency of the base station changes Equation 3 to:

$$x(n) = \sqrt{P} \exp\left\{j\left(2\pi n\left(\frac{\Delta F}{F_s} + \frac{1}{4}\right)\right)\right\} \quad \forall n \in \Psi \quad (4)$$

To simplify Equation 4, the carrier amplitude $\sqrt{P}$ of the demodulated frequency synchronization signal can be assumed to be constant. This assumption is reasonable because the duration of the FCB is relatively short, typically 0.546 µsec, and thus the carrier amplitude $\sqrt{P}$ is not significantly affected by fading. Equation 4 can be further simplified by setting the initial phase $\theta$ to zero.

The signal model of Equation 4 does not take noise into account. The actual received frequency synchronization signal y(n), which includes noise $\nu(n)$, can be represented as:

$$y(n) = x(n) + \nu(n) \quad (5)$$

The complex-valued noise $\nu(n)$ can be written as:

$$\nu(n) = \nu_I(n) + j\nu_Q(n) \quad (6)$$

where $\nu_I(n)$ and $\nu_Q(n)$ represent the in-phase and quadrature phase noise components, respectively. The noise $\nu(n)$ may be assumed to have a white, Gaussian distribution, $\nu(n) \in N(0, \sigma_\nu^2)$ such that the components $\nu_I(n)$ and $\nu_Q(n)$ are real-valued with variance $$\frac{\sigma_v^2}{2}$$

and are assumed to be uncorrelated.

For a signal to noise ration (SNR) equal to $P/\sigma_\nu^2 \gg 1$, the signal model in Equation 5 can be written as:

$$\phi_y(n) = \phi_x(n) + \nu_\phi(n), \quad (7)$$

where $\phi_y(n)$ denotes the phase of actual received signal y(n) with the initial phase $\theta$ set to zero, and $\nu_\phi(n)$ denotes the zero-mean white Gaussian phase noise. The variance $V\{\nu_\phi(n)\}$ of the phase noise $\nu_\phi(n)$ can be expressed as:

$$V\{\nu_\phi(n)\} = \frac{\sigma_v^2}{P} = \frac{1}{SNR}. \quad (8)$$

Assuming there is a frequency offset $\Delta F$ in the actual received signal y(n), Equation 7 can be rewritten as:

$$\phi_y(n) = 2\pi n\left(\frac{\Delta F}{F_s} + \frac{1}{4}\right) + \nu_\phi(n), \quad (9)$$

which corresponds to a straight line with a slope of $2\pi(\Delta F/F_s + 1/4)$ with white noise. Thus, the estimation of the frequency offset $\Delta F$ is related to the estimation of the Equation 9. Subtracting the known factor of $2\pi/4$, this slope can be estimated using the method of linear regression by minimizing the following sum of squared errors:

$$\Lambda = \sum_{\forall n \in \Psi} \left[ \phi(n) - 2\pi n \frac{e\{\Delta F\}}{F_s} \right]^2 \quad (10)$$

where $e\{\Delta F\}$ denotes the estimated frequency offset and $\phi(n)=\phi_y(n)-2\pi n/4$. This estimate is the Maximum Likelihood (ML) estimate if the noise $v_\phi(n)$ is Gaussian.

The set of time indices $\Psi$ is dependent on the choice of the initial time $n_0$. It is convenient to choose $n_0$ so that the set of the indices $\Psi$ is asymmetric, e.g., $\Psi=\{-(N_0-1)2, \ldots, 0, \ldots, (N_0-1)/2\}$ where the number of samples $N_0$ is odd. By employing this set of time indices, the frequency offset $\Delta F$ can be estimated as:

$$e\{\Delta F_0\} = \left( \frac{12}{T_s N_0(N_0^2 - 1)} \sum_{k=0}^{N_0-1} \left( k - \frac{N_0 - 1}{2} \right) \phi(k) \right) \frac{F_s}{2\pi} \quad (11)$$

The estimate $e\{\Delta F_0\}$ is unbiased and has the variance $V\{e\{\Delta F_0\}\}$ where:

$$V\{e\{\Delta F_0\}\} = \frac{6}{SNR \ T_s N_0(N_0^2 - 1)} \left( \frac{F_s}{2\pi} \right)^2 \quad (12)$$

Using the estimated frequency offset $e\{\Delta F_0\}$, the carrier frequency of the base station can be determined, and the mobile station's local frequency reference can be synchronized to the base station.

Figure 2:
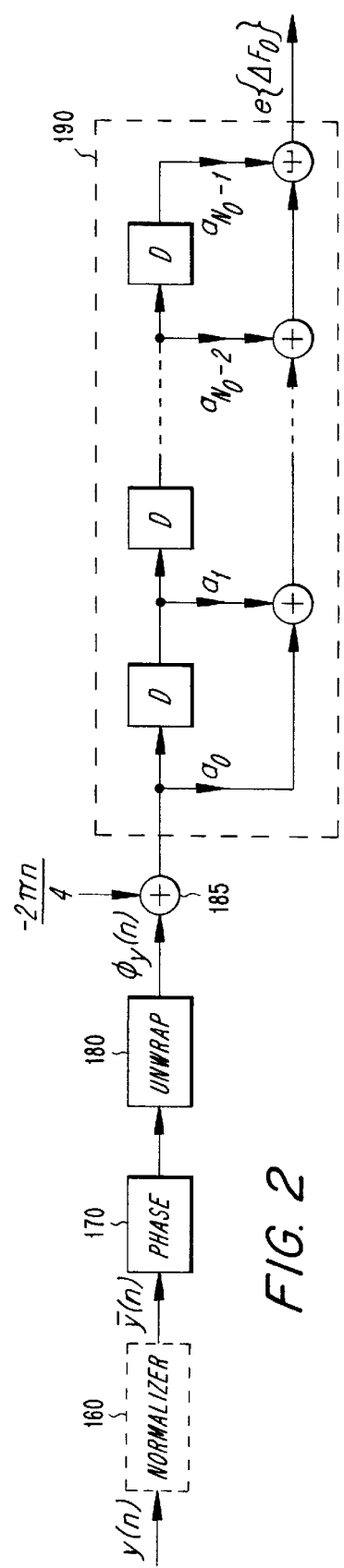
FIG. 2 illustrates an exemplary apparatus for estimating a frequency offset using linear regression.

FIG. 2 illustrates an exemplary apparatus for estimating a frequency offset using linear regression. As shown in FIG. 2, a detected frequency synchronization signal y(n) is normalized in a Normalizer 160 which limits the dynamic range of the detected signal, the phase of the normalized signal is determined in a Phase Measuring unit 170, and the phase is unwrapped in a Phase Unwrapping circuit 180. The quantity $2\pi n/4$ is subtracted from the unwrapped phase signal $\phi_y(n)$ in an adder 185, and the frequency offset $e\{\Delta F_0\}$ is estimated in a Frequency Offset Estimation Circuit 190.

The Frequency Offset Estimation Circuit 190 can be implemented with a Finite Impulse Response (FIR) filter having delay elements D and coefficients $a_k$ where:

$$a_k = \left( \frac{12}{T_s N_0(N_0^2 - 1)} \left( k - \frac{N_0 - 1}{2} \right) \right) \frac{F_s}{2\pi}, \quad (13)$$
$$k = 0, 1, 2 \ldots N_0 - 1$$

The technique of linear regression described above produces a good estimate of the frequency offset. However, assuming that a sample is collected for each symbol of the FCB, and the FCB has 148 symbols, then 148 coefficients have to be computed. This consumes large amounts of memory and processing resources.

According to a second embodiment of the present invention, the amount of memory required to estimate the frequency offset can be reduced by grouping the $N_0$ samples of the FCB into N groups of M phase differences each and then computing the sum of each group. In other words, block sums of phase differences between successively collected samples of the detected frequency synchronization signal can be used to estimate the frequency offset, rather than individual phase differences between successively collected samples. This reduces the number of calculations required for frequency offset estimation.

Segmenting the phase samples of the FCB into different blocks, the sum in Equation 11 is expressed as follows:

$$\sum_{k=0}^{N_0-1} \left( k - \frac{N_0 - 1}{2} \right) \phi(k) = \sum_{i=0}^{N-1} \sum_{j=0}^{M-1} \left( Mi + j - \frac{N_0 - 1}{2} \right) \phi(Mi + j) \quad (14)$$

where N and M are the number of blocks and the number of samples in each block, respectively. The total number of samples is $N_0=NM$.

The right side of Equation 14 can be approximated by setting $$j = \frac{(M - 1)}{2}$$

in $$Mi + j - \frac{N_0 - 1}{2}.$$

Introducing the block phase sum $$\phi_M(i) = \sum_{j=0}^{m-1} \phi(Mi + j),$$

Equation 14 can then be approximated as:

$$\sum_{k=0}^{N_0-1} \left( k - \frac{N_0 - 1}{2} \right) \phi(k) \approx M \sum_{k=0}^{N-1} \left( k - \frac{N - 1}{2} \right) \phi_M(k), \quad (15)$$

Substituting this expression in Equation 11, the frequency offset $\Delta F_M$ can be estimated as:

$$e\{\Delta F_M\} = \left( \frac{12 M}{T_s N_0(N_0^2 - 1)} \sum_{k=0}^{N-1} \left( k - \frac{N - 1}{2} \right) \phi_M(k) \right) \frac{F_s}{2\pi}, \quad (16)$$

Inserting the sample frequency $F_S/M$, the sample period $T_S M$, and the number of phase sums $N_0/M$ into Equation 12, the variance $V\{e\{\Delta F_M\}\}$ of the estimated frequency offset $e\{\Delta F_M\}$ can be given as:

$$V\{e\{\Delta F_M\}\} = \frac{6}{SNR \ T_s N_0(N_0^2 - M^2)} \left( \frac{F_s}{2\pi} \right)^2 \quad (17)$$

Grouping and averaging M phase differences reduces the size of the memory and processing resources required for frequency offset estimation. The reduction is proportional to the size of M. However, the larger M gets, and the smaller N gets, the more the approximation in Equation 16 deviates from the result of Equation 11. This can be seen from Equation 17 which shows that the variance $V\{e\{\Delta F_M\}\}$ increases by increasing M and thereby decreasing N. The choice of M is thus a trade-off between accuracy and memory requirements.

In addition, it is important to select values for N and M so that the value $N_0=NM$ coincides as closely as possible with the total number of samples of the FCB. $N_0$ should be small enough to exclude samples outside the FCB and simultaneously large enough to include as many samples of the FCB as possible. Assuming one sample is collected for each symbol of the FCB, and the FCB is 148 symbols long, N and M should be selected so that NM is less than or equal to 148.

N can be set at 17, for example, and M can be set at 8, the total number of samples then being NM=136. This leaves room for 12 phase samples of detection error and thus ensures that data outside of the FCB will not be used in the frequency offset estimation.

It should be noted that, by selecting N and M appropriately, this method can be applied to other types of frequency synchronization signals obtained via other types of modulation methods.

Another problem with the technique of linear regression described above with reference to FIG. 2 is that it requires phase unwrapping so that the phase variation between samples is limited to ±π. Conventional phase unwrapping requires phase shifting of samples by ±2π and a memory to keep track of the phase shifts. Although this memory can be reset whenever a FCB is detected, the memory must be large enough to store the phase shifts for each sample of an FCB. To reduce the amount of required memory, the method of linear regression can be modified to compensate for the phase variations without having to shift each sample and keep track of the phase shift in a memory. According to the second embodiment of the present invention, the phase difference between successively collected samples of the FCB can be used for this purpose.

The successive phase sums $\phi_M(k)$ are related to each other as follows:

$$\phi_M(k) = \phi_M(k-1) + \sum_{j=1}^{M} (\phi(kM+j) - \phi(kM+j-1)) \quad (18)$$

Since the phase samples are equidistant, $\phi_M(k)$ is related to its initial value $\phi_M(k_0)$ and the sum $\Delta\phi_M(j)$ of the phase differences between successively collected samples of the FCB as follows:

$$\phi_M(k) = \phi_M(k_0) + \sum_{j=k_0+1}^{k_0+k} \Delta\phi_M(j) \quad (19)$$

Substituting the result in Equation 19 for $\phi_M(k)$ in Equation 16, the frequency offset $e\{\Delta F_M\}$ can be estimated as:

$$e'\{\Delta F_M\} = \qquad (20)$$
$$\left(\frac{12M}{T_s N_0 (N_0^2 - 1)} \sum_{k=0}^{N-1} \left(k - \frac{N-1}{2}\right) \left[\phi_M(k_0) + \sum_{j=k_0+1}^{k_0+k} \Delta\phi_M(j)\right]\right) \frac{F_s}{2\pi}$$

The phase initial value, $\phi_M(k_0)$ does not have any influence in Equation 20 since $$\sum_{k=0}^{N-1} \left(k - \frac{N-1}{2}\right) = 0.$$

By performing frequency offset estimation in this manner, the phase variation between successive samples of the FCB is compensated for, i.e., phase unwrapping is achieved, without requiring a memory to keep track of phase shifts. This approach can be implemented with the apparatus shown in FIG. 3.

The apparatus shown in FIG. 3 is similar to that shown in FIG. 2, although the Normalizer 160 and the Phase Measuring unit 170 have been omitted from FIG. 3 in the interest of simplicity. Instead of an adder 185, however, the apparatus shown in FIG. 3 includes a Differentiator 200 and a Sum & Dump Circuit 210. In addition, the apparatus shown in FIG. 3 does not include a Phase Unwrapper 180.

Referring to FIG. 3, the phase difference $\Delta\phi_y(n)$ between successively collected samples of the received and demodulated frequency synchronization signal is computed in a known manner in the Differentiator 200. The Differentiator 200 can be conveniently implemented by, for example, a high pass filter. Each phase difference is added to accumulated previous phase differences by the Sum & Dump Circuit 210.

The Sum & Dump Circuit 210 can be implemented by an adder and a filter, such as a FIR filter, with M coefficients set to unity. Alternately, the phase differences can be added by other devices, e.g., an integrate and dump circuit, a resettable integrator, or a low pass filter. When M phase differences have been added, the sum is "dumped", i.e., output by the Sum & Dump Circuit 210 to a Frequency Offset Estimation Circuit 220.

The Frequency Estimation Circuit 220 computes a weighted sum of groups of phase differences between successively collected samples of the detected frequency synchronization signal to estimate the frequency offset, thus compensating for phase variations between successively collected samples of the frequency synchronization signal, i.e., performing phase unwrapping, without requiring a memory to keep track of phase shifts. The Frequency Estimation Circuit 220 can be implemented with a FIR filter with delay elements D, accumulators, and coefficients $b_k$ where:

$$b_k = \left(\frac{12M}{T_s N_0 (N_0^2 - 1)} \left(k - \frac{N-1}{2}\right)\right) \frac{F_s}{2\pi}, \quad (21)$$
$$k = 0, 1, 2, \ldots, N-1.$$

To simplify the apparatus shown in FIG. 3, the coefficients $c_k$ can be used instead of the coefficients $b_k$ where:

$$c_k = \sum_{j=k}^{N-1} b_j, \quad k = 0, 1, 2, \ldots, N-1 \quad (22)$$

This avoids the need for the accumulators shown in FIG. 3. An implementation of this approach is shown in FIG. 4A. The apparatus shown in FIG. 4A is similar to that in FIG. 3, except that a Frequency Estimation Circuit 230 is used instead of the Frequency Estimation Circuit 220. The Frequency Estimation Circuit 230 can be implemented with a FIR filter with delay elements D and coefficients $c_0, c_1, \ldots c_{N-2}, C_{N-1}$. As can be seen from FIG. 4A, the Frequency Offset Estimation Circuit 230 is a simpler device than the Frequency Estimation Circuit 220.

The embodiments described above demonstrate how a frequency offset in a received frequency synchronization signal can be estimated. There are different disturbances which affect this estimation, e.g. noise, fading, etc. If the estimated frequency offset is not accurate, the local frequency reference of the mobile station will not be properly synchronized to the carrier frequency of the base station. Thus, it is important to be able to determine the accuracy of the estimated frequency offset so that it can be adjusted if necessary.

One way to determine the accuracy of the estimated frequency offset is to use the variance as expressed in Equation 17. However, this requires knowledge of the SNR.

According to a third embodiment of the present invention, another technique is provided which does not require knowledge of the SNR. According to the third embodiment, a quality factor δ can be estimated which indicates accuracy of the estimated frequency offset. The estimated quality factor e{δ} can be computed by, for example, adding the absolute values of the differences between each of the N sums of M phase differences and the estimated frequency offset e{ΔF$_M$}, as follows:

$$e\{\delta\}=|\Delta\phi_M(j)-\text{Me}\{\Delta F_M\}|+|\Delta\phi_M(j-1)-\text{Me}\{\Delta F_M\}|\ldots+|\Delta\phi_M(j-N+2)-\text{Me}\{\Delta F_M\}|+|\Delta\phi_M(j-N+1)-\text{Me}\{\Delta F_M\}| \quad (23)$$

Ideally, these differences and thus the resulting estimated quality factor e {δ} should be zero. Any deviation indicates the presence of noise and/or an estimation error. Thus, the lower the value of estimated quality factor e {δ}, the more accurate the estimated frequency offset.

Figure 4B:
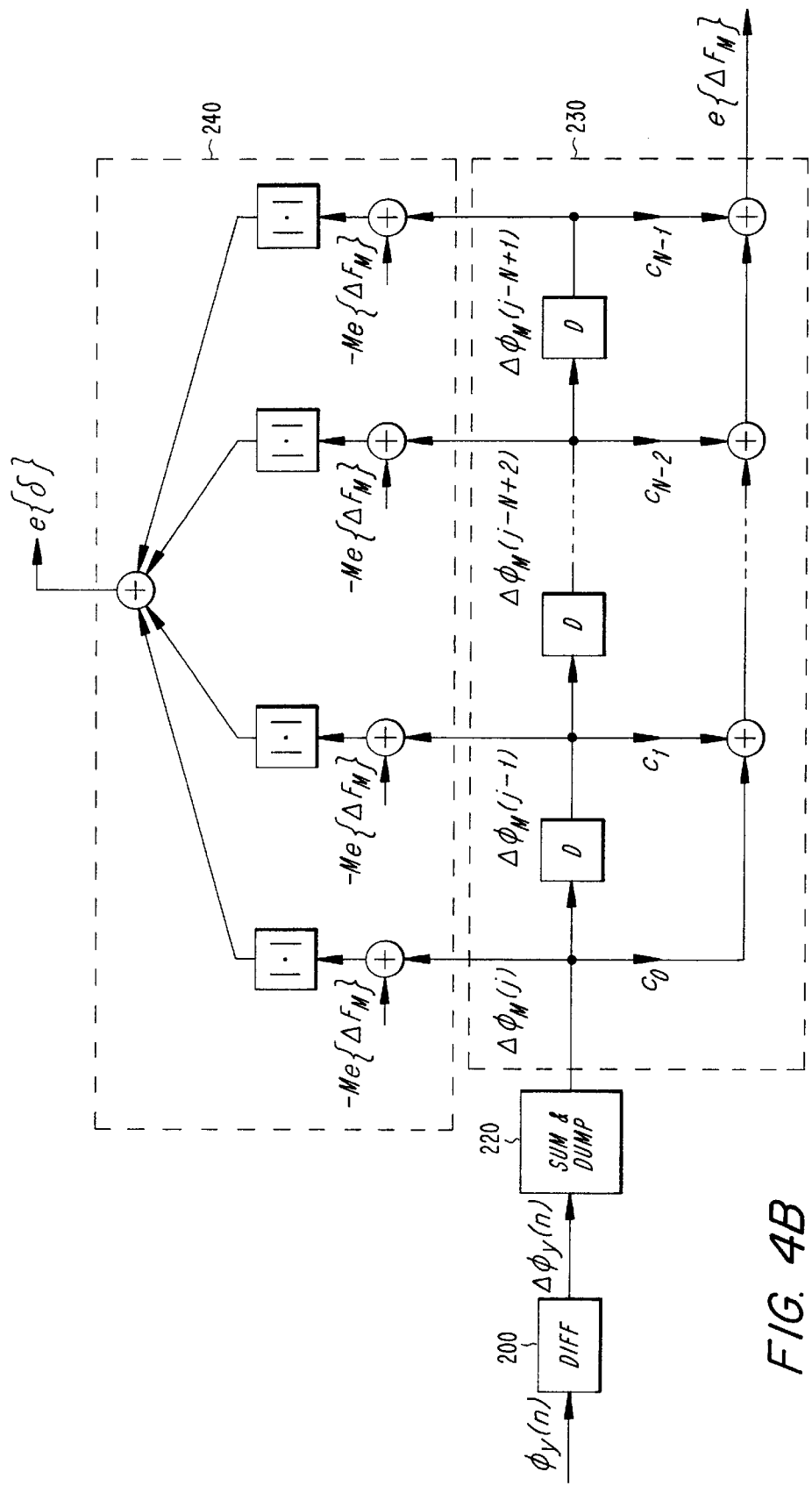
FIG. 4B illustrates an exemplary apparatus for estimating a quality factor according to a third embodiment of the present invention.

FIG. 4B illustrates an apparatus for estimating the frequency offset ΔF$_M$ and the quality factor δ for evaluating the estimate e{ΔF$_M$} according to the third embodiment of the present invention. The apparatus shown in FIG. 4B is the same as that shown in FIG. 4A, except that it includes a Quality Factor Estimation Circuit 240. The Quality Factor Estimation Circuit 240 computes the quality factor estimate e{δ} according to Equation 23 above. If the estimated quality factor e{δ} indicates that the estimated frequency offset is not sufficiently accurate, i.e., the estimated quality factor is greater than a preconfigured threshold, the estimated frequency offset can be adjusted, e.g., computed again.

The Quality Factor Estimation Circuit 240 can be implemented with N subtractors for computing N differences between each of the N groups of M phase differences and the estimated frequency offset, N absolute value circuits for computing the absolute values of the N differences, and an adder for adding the N absolute values to produce the estimated quality factor e{δ}. Although shown as being separate from the Frequency Offset Estimation Circuit 230 for ease of illustration and explanation, it should be understood that the Quality Factor Estimation Circuit 240 and the Frequency Offset Estimation Circuit 230 can be combined in a single device.

To obtain an optimal frequency offset estimation, ideally only samples of the FCB should be used. According to a fourth embodiment of the present invention, the received signal can be prefiltered in a frequency selective filter to select the frequency band corresponding to the FCB to discriminate the FCB from noise and thus enhance the signal to noise ratio.

As explained above, in a system employing the GSM standard, the frequency of the transmitted frequency synchronization signal is approximately 67.7 KHz. The frequency of the received frequency synchronization signal may deviate from 67.7 KHz, due to the lack of the synchronization between the carrier frequency of the base station and the local frequency reference of the mobile station. The amount of frequency deviation that can be tolerated depends on the precision of the internal crystal oscillator of the detector in the mobile station. For example, assuming that the precision of this crystal is ±16 parts per million (ppm), in the GSM 900 MHZ band, there can be a frequency offset of up to ±14.4 KHz in the received frequency synchronization signal. Thus, theoretically the bandwidth of a frequency selective filter can be set up to ±14.4 KHz around 67.7 KHz, i.e., between 53.3 KHz and 82.1 KHz to suppress the background noise. According to an exemplary embodiment, a slightly narrower bandwidth can be conveniently used, e.g., ±13 KHz around 67.7 KHz, corresponding to approximately 0.05 F$_s$.

The bandwidth of the frequency selective filter can be suited to the standard of the communication system. For a system using the Cordless Telephony System (CTS), for example, the frequency deviation may be twice that of a system using the GSM standard, due to the addition of the frequency error of the mobile station and the home base station. Thus, a frequency deviation of up to ±28.8 KHz can be tolerated in a system employing the CTS standard. The filter bandwidth in such a system can thus theoretically be chosen to be up to ±28.8 KHz around the frequency of the transmitted frequency synchronization signal. When actually implementing the selective filter, the bandwidth can be conveniently selected to be ±27 KHz around the frequency of the transmitted frequency synchronization signal, corresponding to approximately 0.1 F$_s$.

To implement this frequency selective filter, the received signal can be shifted from the center frequency of 67.7 KHz to the baseband, and then the shifted signal can be lowpass filtered. The shifting can be implemented by multiplying the in-phase and quadrature-phase components of the received frequency synchronization signal by exp(-2πjn 67.7/270.833)=exp(-πjn/2), which is a sequence of {1, 0, -1, 0} in the real and imaginary domains.

The shifting can be performed according to the following:

$$(yI(n)+jyQ(n))e^{-\pi jn/2}=\begin{cases}yI(n)+jyQ(n),&n=0,4,8,\ldots;\\yi(n)-jyQ(n),&n=1,5,8,\ldots;\\-yI(n)-jyQ(n),&n=2,6,10,\ldots;\\-yI(n)+jyQ(n),&n=3,7,11,\ldots;\end{cases} \quad (24)$$

where y$_I$(n) and y$_Q$(n) denote the in-phase and quadrature-phase components of the actual received frequency synchronization signal, respectively, i.e., y(n)=y$_I$(n)+jy$_Q$(n). Thus, the shifting can be performed by changing the sign of y$_I$(n) and y$_Q$(n) and then combining these components.

Figure 4C:
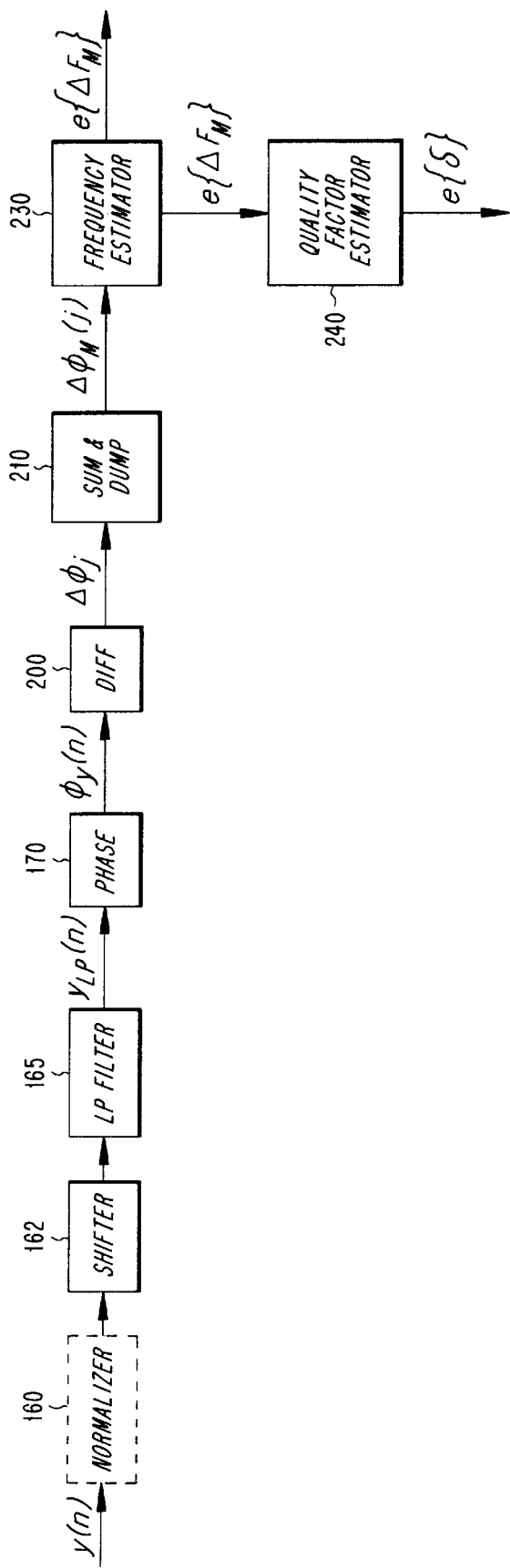
FIG. 4C illustrates an exemplary apparatus for estimating a frequency offset including prefiltering according to a fourth embodiment of the present invention.

This approach can be implemented in the apparatus shown in FIG. 4C. The elements shown in FIG. 4C are the same as those in FIG. 4B, except for the addition of a LP Filter 165 and a Shifter 162. In addition, FIG. 4C shows the Normalizer 160 and the Phase Measuring Circuit 170 which are omitted from FIG. 4B.

As illustrated in FIG. 4C, a normalized frequency synchronization signal is shifted the Shifter 162. The Shifter 162 shifts the normalized frequency synchronization signal according to Equation 24, and can be implemented with, e.g., a multiplier. The shifted signal is low pass filtered in the LP Filter 165, and the phase φ$_{yLP}$(n) of the filtered signal y$_{LP}$(n) is then measured in the Phase Measuring Circuit 170. From this point, the frequency offset and the quality factor are estimated as described above with reference to FIGS. 4A and 4B.

The frequency selective filter according to the fourth embodiment enhances the SNR by reducing the noise outside the frequency band of interest. Theoretically, the noise is reduced to zero outside the frequency band of interest, and the SNR increases by 10 log(0.5/0.05)=10 dB and 10 log(0.5/0.1)=7 dB in systems employing the GSM standard and the CTS standard, respectively. Thus, the SNR is sufficient to make the assumption in Equation 7 reasonable. In reality, the noise is not reduced to zero, but the noise reduction is still sufficient to produce the desired SNRs.

The use of a frequency selective filter can affect the distribution of the white Gaussian noise ν(n) and thus affect the results of the linear regression. However, the assumption of having white noise is still valid if the bandwidth of the filter is relatively larger, e.g., several kilo hertz larger, than the frequency band of interest.

Figure 5A:
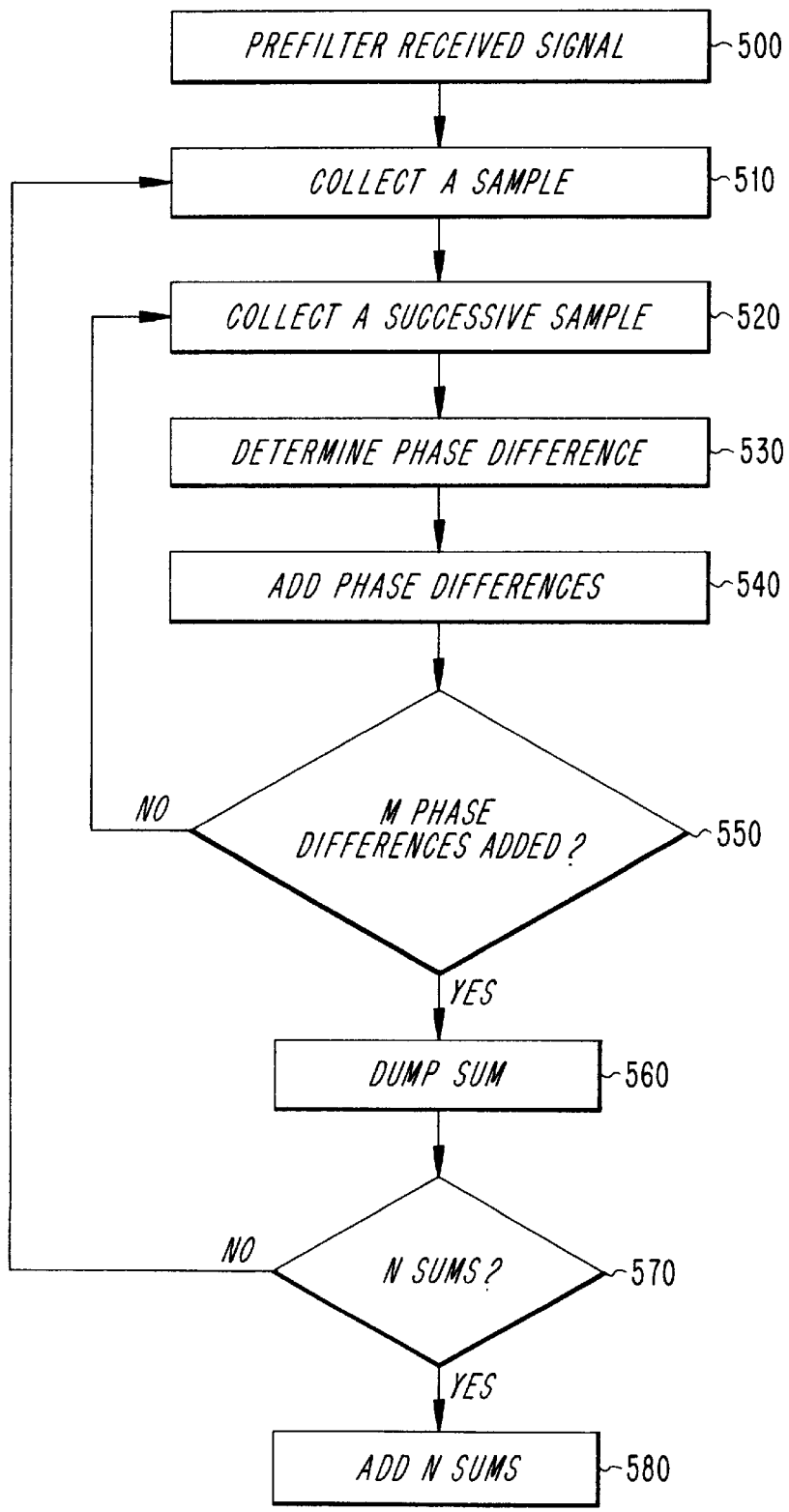
FIG. 5A illustrates an exemplary method for estimating a frequency offset according to the preset invention.

FIG. 5A illustrates an exemplary method for estimating a frequency offset according to the present invention. The method begins at step 500, at which a received signal is prefiltered to improve detection of the frequency synchronization signal. Next, at step 510, a sample of the detected frequency synchronization signal is collected. At step 520, a successive sample is collected. At step 530, the phase difference between the successively collected samples is computed. Next, at 540, the phase difference is added to other accumulated phase differences. At step 550, a determination is made whether M phase differences have been added. If not, the process returns to step 520. If M phase differences have been added, the sum of the M phase differences is dumped at step 560. Next, at step 570, a determination is made whether N sums of M phase differences have been dumped. If not, the process returns to step 510, and a new sample is collected. If so, the N sums are added at step 580. According to an exemplary embodiment, this step can be performed by computing a weighted average of the N sums using, for example, linear regression, and the result is the estimated frequency offset.

Figure 5B:
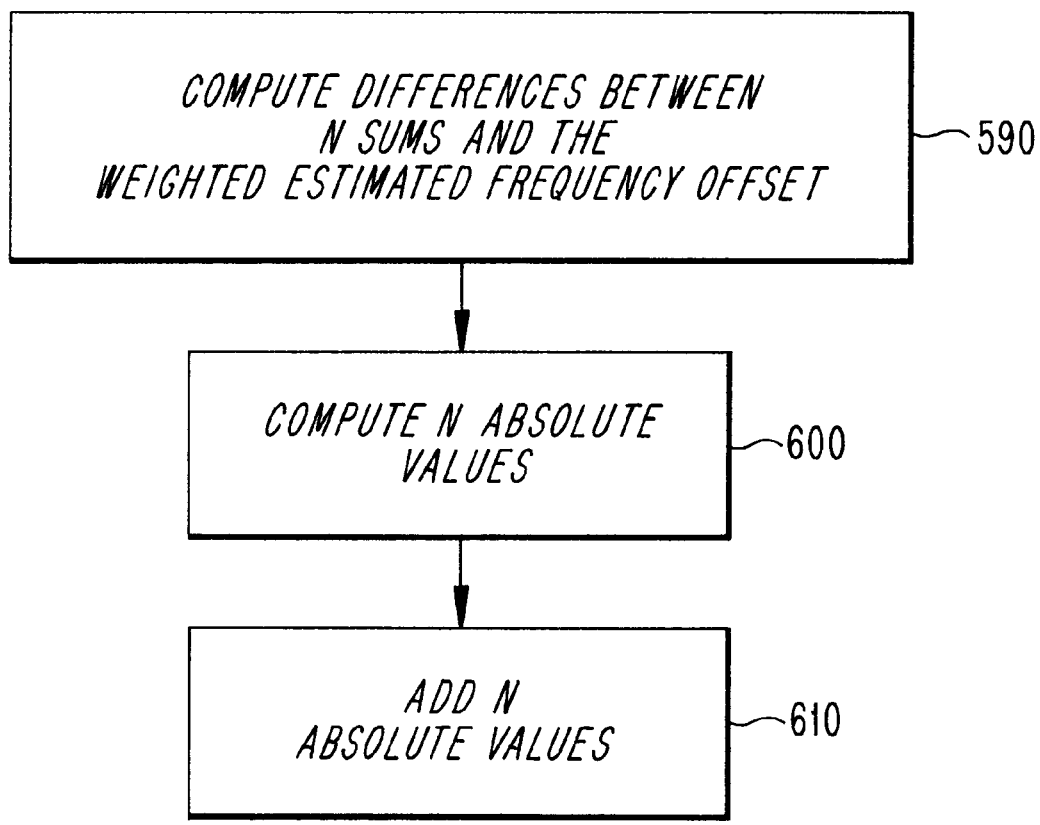
FIG. 5B illustrates an exemplary method for estimating a quality factor according to the present invention.

FIG. 5B illustrates an exemplary method for a estimating quality factor according to the present invention. The process starts after the frequency offset has been estimated. At step 590, the estimated frequency offset, weighted by M, is subtracted from each of the N sums of M phase differences to produce N differences. Next, at step 600, the absolute values of the N differences are computed. Finally at step 610, the N absolute values are added to produce the estimated quality factor.

Simulated results of frequency offset estimation using different approaches and quality factor estimation are illustrated in FIGS. 6A–9D and FIGS. 10A–11D, respectively. The applicable transmission channel in the following simulations is a Typical Urban channel. Depending on the number of obstacles between a mobile station and a base station, the transmission channel can be Typical Urban or Rayleigh. The Rayleigh channel is typically used when the mobile station is in a rural area.

In a system using the GSM standard, a typical velocity of a mobile station using a Rayleigh channel is between 110 and 250 kilometers per hour (km/h). This corresponds to mobile station in an automobile traveling on a highway or in a fast train. When the number of obstacles in the rural area increases, the disturbing factor of the Rayleigh fading increases, and the Typical Urban channel is used instead of the Rayleigh channel. A typical velocity for a mobile station using the Typical Urban channel is between 3 and 50 km/h. This corresponds to a mobile station used by a person walking in an urban area or in an automobile traveling on a city street, respectively.

In a CTS system, the velocity of the mobile station is typically assumed to be 3 km/h for both Rayleigh and Typical Urban channels. This corresponds to a mobile station moving in a rural area with the velocity of 3 km/h.

The results of frequency offset estimation are similar for both channels at different velocities. Therefore, only one case is described below. In the following simulations, the results for a mobile station using the Typical Urban channel at the velocity 3 km/h are described, since this represents a difficult scenario.

FIGS. 6A–6D illustrate the error probabilities of frequency offset estimation using basic linear regression, modified linear regression according to the present invention, conventional techniques and conventional techniques with prefiltering, respectively. The statistical uncertainties of these results were reduced by running one thousand simulations.

In FIGS. 6A–6D, error probabilities are shown for a system using the GSM standard with an SNR of approximately 7.5 dB. There are five different curves in each figure, the curves representing, from top to bottom, the probability of having an estimation error of 50, 100, 200, 400, and 800 Hz, respectively.

Figure 6A:
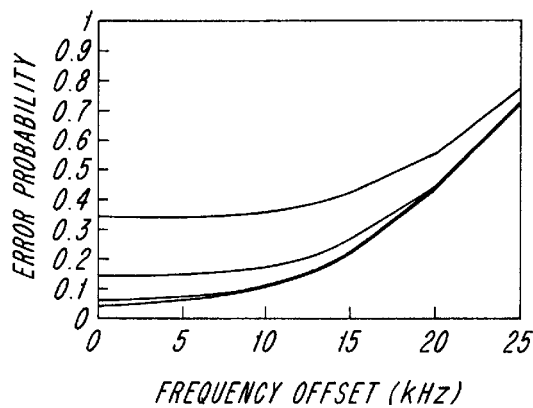
FIGS. 6A–6D and 7A–7D illustrate estimation error probabilities using various frequency offset estimation techniques in a system employing the GSM standard.
Figure 6B:
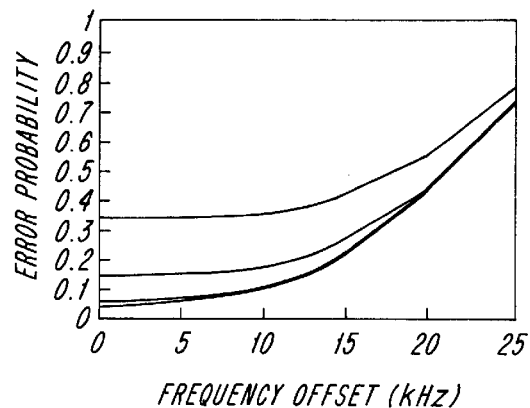
Figure 6C:
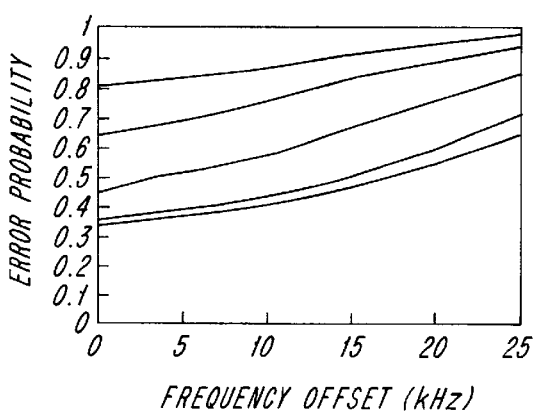
Figure 6D:
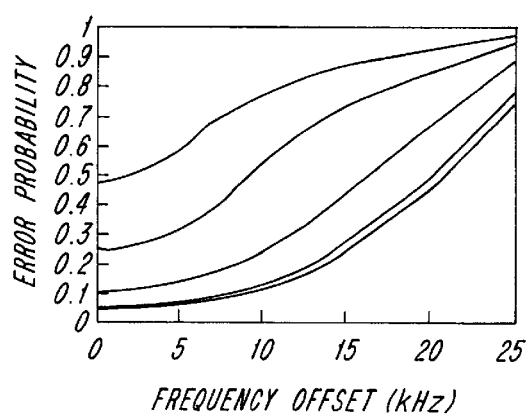
Figure 7A:
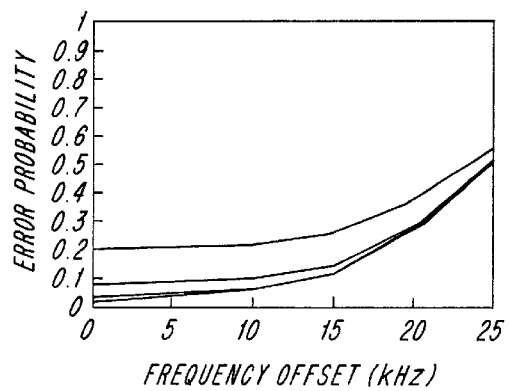
Figure 7B:
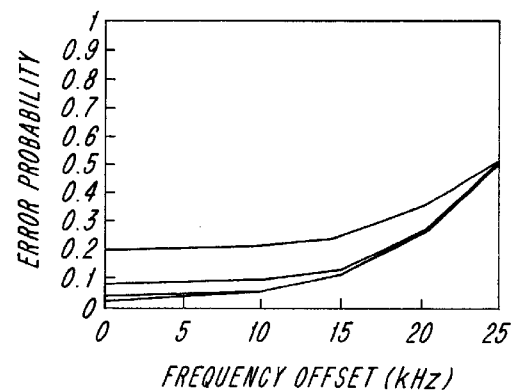
Figure 7C:
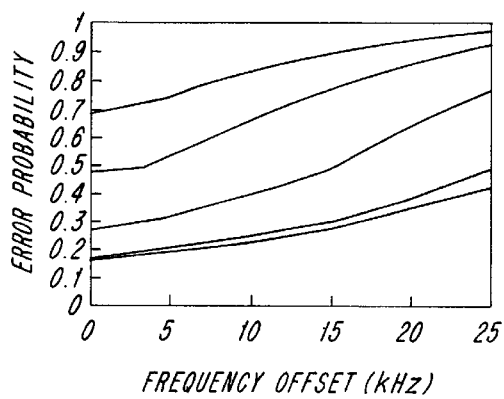
Figure 7D:
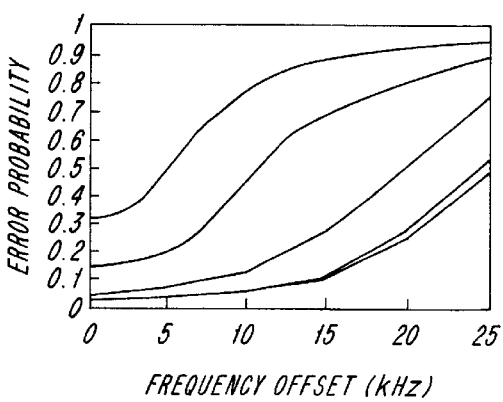
Figure 8A:
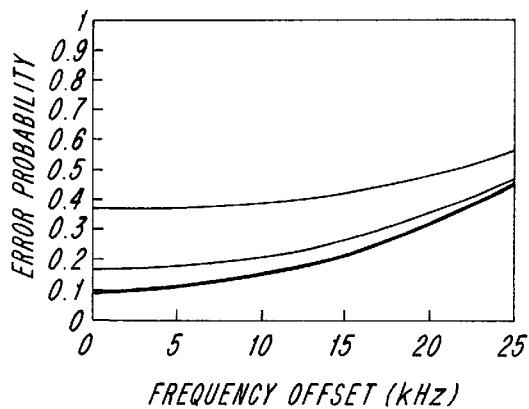
FIGS. 8A–8D and 9A–9D illustrate estimation error probabilities using various frequency offset estimation techniques in a system employing the Cordless Telephony System (CTS) standard.
Figure 8B:
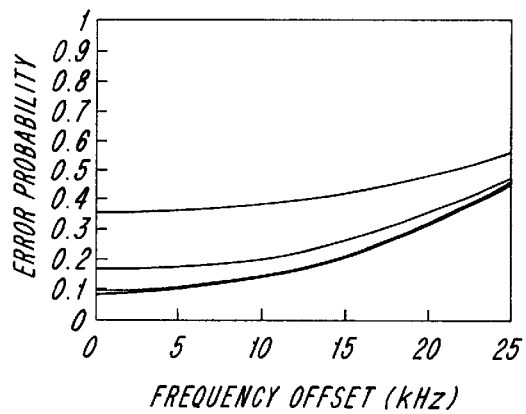
Figure 8C:
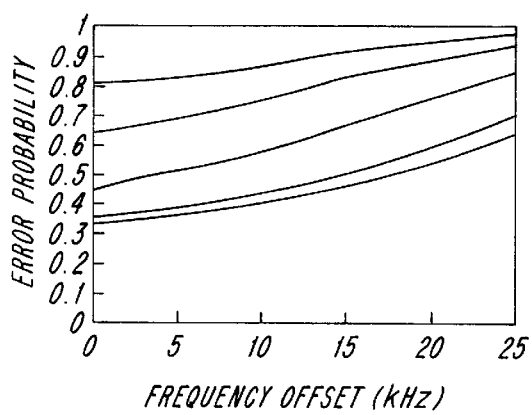
Figure 8D:
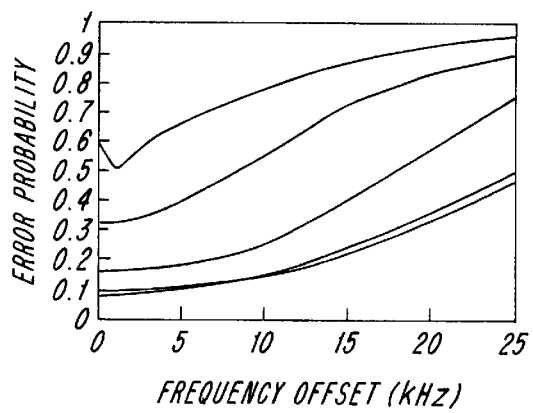
Figure 9A:
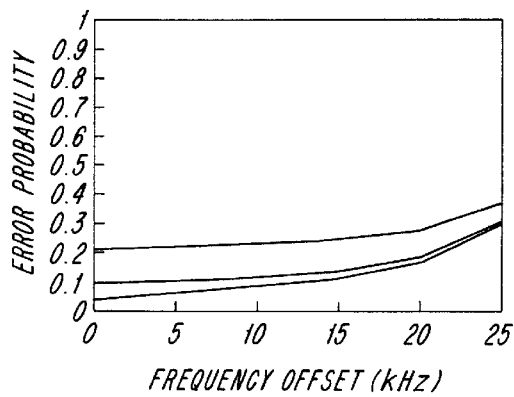
Figure 9B:
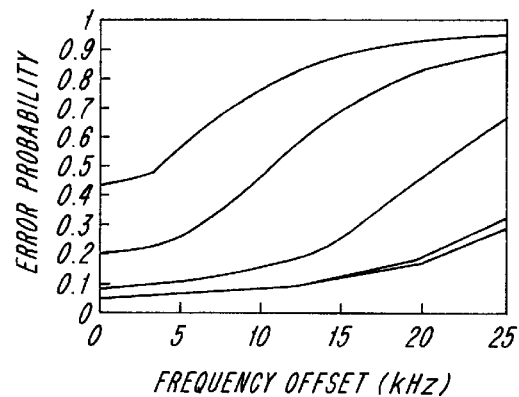
Figure 9C:
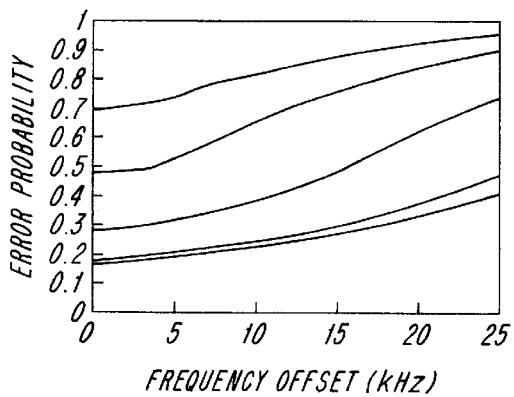
Figure 9D:
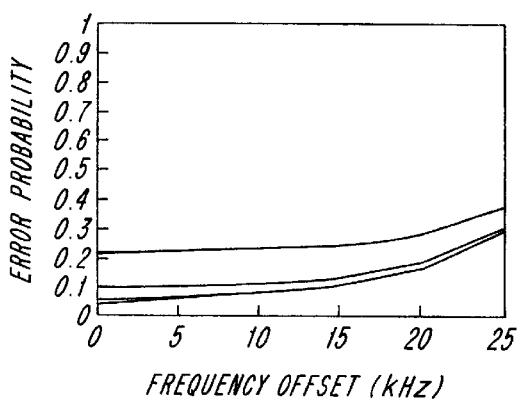
Figure 10A:
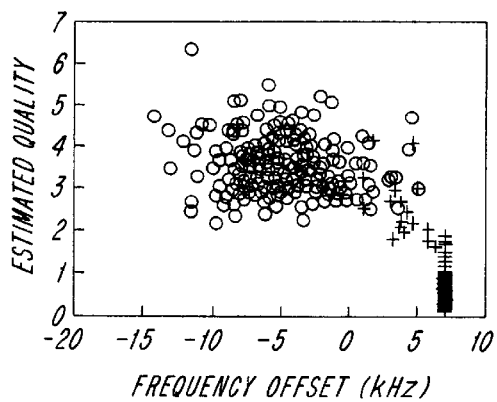
FIGS. 10A–10D illustrate the estimated quality factor as a function of the estimated frequency offset in a system employing the GSM standard at various SNRs.
Figure 10B:
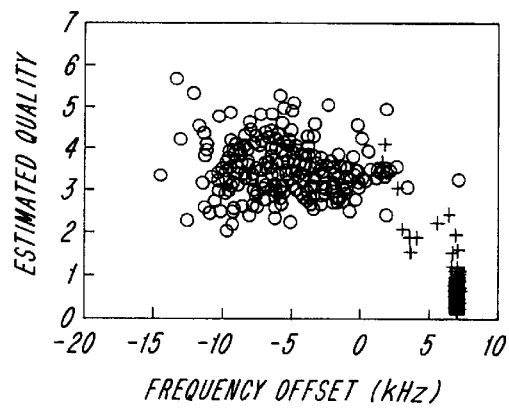
Figure 10C:
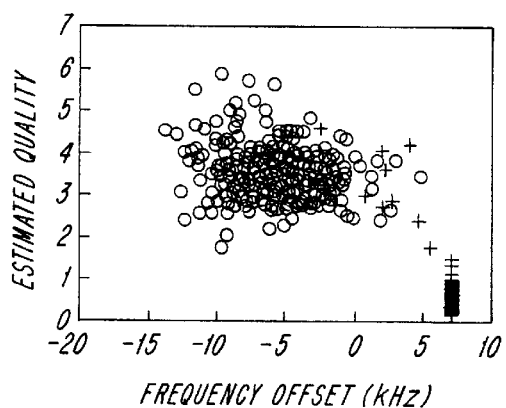
Figure 10D:
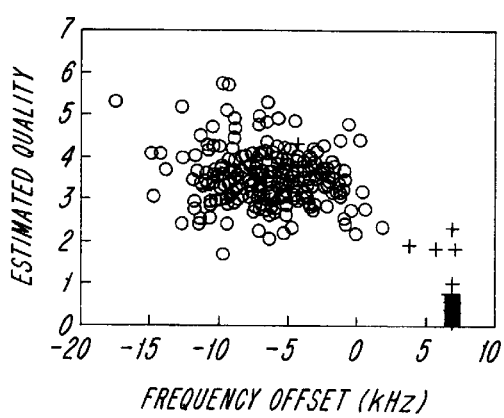
Figure 11A:
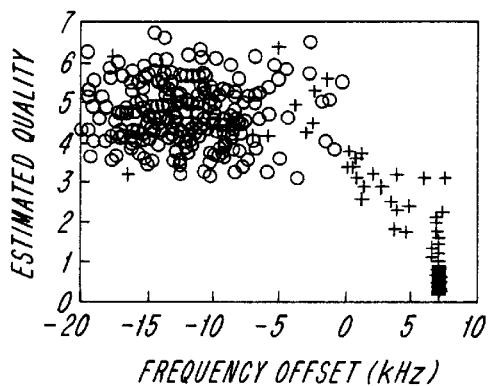
FIGS. 11A–11D illustrate the estimated quality factor as a function of the estimated frequency offset in a system employing the CTS standard system at various SNRs.
Figure 11B:
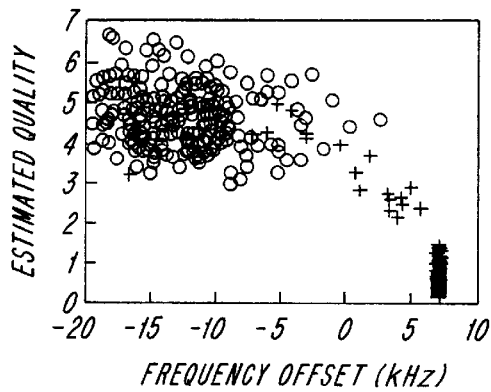
Figure 11C:
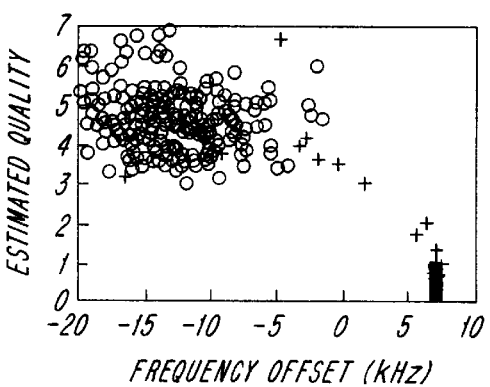
Figure 11D:
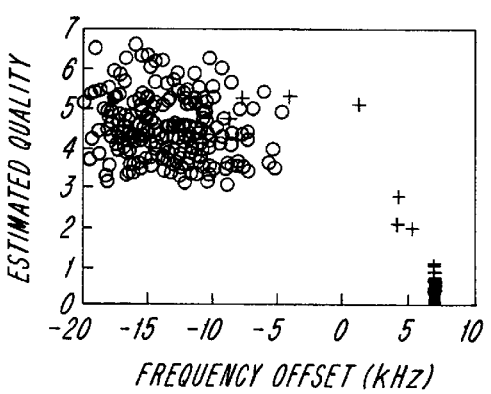

As can be seen from comparing FIGS. 6A and 6B with FIGS. 6C and 6D, the error probability is lower using linear regression to estimate the frequency offset than conventional techniques. Even including prefiltering in conventional techniques, as represented in FIG. 6C, does not produce results as good as those obtained using linear regression. As can be seen from comparing FIGS. 6A and 6B, the modified linear regression technique according to the present invention produces results as good as the linear regression technique.

FIGS. 7A–7D are similar to FIGS. 6A–6D, except that the error probabilities are represented for an SNR of approximately 11 dB. It is evident from a comparison of FIGS. 7A and 7B with FIGS. 7C and 7D that using linear regression to estimate the frequency offset produces better results than conventional techniques at this SNR, as well. In addition, it is evident from a comparison of FIGS. 7A and 7B that the modified linear regression technique according to the present invention produces results as good as the basic linear regression technique.

It can be seen from FIGS. 6A–7D that the performance the frequency offset estimation deteriorates when ΔF exceeds 15 Khz due to the use of low pass filter 165 in FIG. 4C. As noted above, however, the frequency offset ΔF does not exceed ±14.4 KHz in a system using GSM 900 with a crystal with a precision of ±16 ppm.

Similar results occur in system using the CTS standard as represented in FIGS. 8A–8D and 9A–9D. FIGS. 8A–8D, like FIGS. 6A–6D, illustrate the error probabilities of frequency offset estimation using linear regression, modified linear regression according to the present invention, conventional techniques and conventional techniques with prefiltering, respectively. In FIGS. 8A–8D, error probabilities are shown for a system with an SNR of approximately 7.5 dB. FIGS. 9A–9D are similar to FIGS. 8A–8D except that the applicable SNR is approximately 11 dB.

As can be seen from a comparison of these figures, the results of the linear regression techniques for frequency offset estimation are better than the results produced by conventional techniques, and the modified linear regression technique according to the present invention produces results as good as the basic linear regression technique.

Comparing FIGS. 8A–9D with FIGS. 6A–7D, the performance of frequency offset estimation is slightly improved for higher frequency offsets in a system using the CTS standard versus a system using the GSM standard. It is also evident, however, that there is also a slight overall deterioration in the performance of frequency offset estimation in a system using the CTS standard versus a system using the GSM standard.

FIGS. 10A–10D and 11A–11D illustrate exemplary results of quality factor estimation for a system using the GSM standard and a system using the CTS standard, respectively. The applicable SNRs for FIGS. 10A and 11A, FIGS. 10B and 11B, FIGS. 10C and 11C, and FIGS. 10D and 11D are 7.5, 11, 15, and 20 dB, respectively. Due to statistical uncertainties, each simulation was repeated 200 times.

In these figures, the estimated quality factor is plotted as function of the frequency offset, where "+" represents an estimated quality factor for a detected frequency synchronization signal, and "o" represents an estimated quality factor for signals other than the FCB. For purposes of these simulation, the frequency offset for a detected frequency synchronization signal was set at 7 KHz.

As can be seen from these figures, where there is a "+" the estimated quality factor e{δ} has both a small value and a small variance. In contrast, the variance and the value of the estimated quality factor e{δ} is large where there is a "o". Therefore, by defining a threshold, the estimated quality factors for a detected frequency synchronization signal and other signals can be separated into two different clusters. As can be seen from a comparison of FIGS. 10A–10D with FIGS. 11A–11D, these clusters are closer to each other in a system using the GSM standard than in a system using the CTS standard. However, the estimated quality factor e{δ} has more variance in a system using the CTS standard than a system using the GSM standard.

It can also be seen from FIGS. 10A–11D that, due to the prefiltering of the frequency synchronization signal, the estimated frequency offset, ΔF, is in the tolerable range of a detector even when there is no frequency synchronization signal to detect. Thus, the reasonable values of the frequency offset ΔF cannot be relied upon to indicate whether the signal is a frequency synchronization signal. The quality factor is, therefore, very important in determining whether or not the detected signal is a frequency synchronization signal.

According to the present invention, memory requirements for estimating a frequency offset in a detected frequency synchronization signal are reduced by dividing a demodulated frequency synchronization signal into a number of N groups of M phase differences within each group. This also avoids the need for phase unwrapping, thus further reducing the memory requirements. The frequency synchronization signal can be prefiltered to improve detection. All the differentiation, adding, filtering, etc. represented in the equations above can be performed, for example, in an ASIC chip. By reducing the memory requirements, the present invention can be implemented in hardware which reduces power consumption.

Although particularly important for initial synchronization when a mobile station enters a new area served by a new base station, the present invention is also applicable to maintaining synchronization between a mobile station or any other type of remote station and a base station. This is important because a frequency offset which will disrupt synchronization can arise due to several reasons, e.g., differences in ambient temperature, aging of system components, handoff, etc.

Furthermore, although described above with references to an application in a GSM mobile radio communication system, it will be appreciated by those of ordinary skill in the art that this invention can be embodied in other specific forms without departing from its essential character. For example, the invention is applicable to other communication systems or any system employing a modulated periodic signal for synchronization. The embodiments described above should therefore be considered in all respects to be illustrative and not restrictive.

We claim:

1. In a communication system including at least one transmitter and at least one receiver, a method for estimating a frequency offset between a carrier frequency of the transmitter and a local frequency reference of the receiver, the method comprising the steps of:
    a) determining a phase difference between successive samples of a frequency synchronization signal transmitted by the transmitter and received by the receiver;
    b) adding the phase difference to accumulated phase differences;
    c) repeating steps a)–b) until M accumulated phase differences have been added, where M is an integer;
    d) dumping the sum of the M accumulated phase differences, resulting in zero accumulated phase differences;
    e) repeating steps a)–d) until N sums of M accumulated phase differences have been dumped where N is also an integer; and
    f) adding the N sums of the M accumulated phase differences to produce the estimated frequency offset.

2. The method of claim 1, wherein the step of adding the N sums comprises:
    weighting each of the N sums; and
    adding the weighted N sums.

3. The method of claim 1, wherein the step of adding the N sums comprises computing a weighted average of the N sums.

4. The method of claim 1, wherein the step of adding the N sums is performed using linear regression.

5. The method of claim 1, wherein the step of adding the N sums compensates for phase variations in the detected frequency synchronization signal.

6. The method of claim 1, wherein the step of adding the N sums achieves phase unwrapping.

7. The method of claim 1, further comprising a step of:
    i) estimating a quality factor for determining the accuracy of the estimated frequency offset.

8. The method of claim 7, wherein the step of estimating the quality factor includes the steps of:
    computing N differences, each between one of the N sums of the M accumulated phase differences and the estimated frequency offset;
    computing absolute values of the N differences; and
    adding the N absolute values to produce the estimated quality factor.

9. The method of claim 1, further comprising a step of prefiltering a signal received by the receiver.

10. In a communication system including at least one transmitter and at least one receiver, an apparatus for estimating a frequency offset between a carrier frequency of the transmitter and a local frequency reference of the receiver, the apparatus comprising:
    a differentiator for computing a phase difference between successive samples of a frequency synchronization signal transmitted by the transmitter and received by the receiver;
    an adder for adding the phase difference to accumulated phase differences, wherein phase differences of successive samples are computed and added to accumulated phase differences until M accumulated phase differences have been added, where M is an integer, at which point the adder dumps the sum of the M phase differences, resulting in zero accumulated phase differences; and
    a frequency offset estimation circuit for receiving the dumped sum of M phase differences, wherein the differentiator continues computing the phase differences of successive samples, and the adder continues accumulating and adding phase differences and dumping the sum of M phase differences until N sums of M phase differences have been dumped, where N is also an integer at which point the frequency offset estimation circuit adds the N sums of the M phase differences to produce the estimated frequency offset.

11. The apparatus of claim 10, wherein the frequency estimation circuit adds the N sums by weighting each of the N sums and adding the weighted N sums.

12. The apparatus of claim 10, wherein the frequency estimation circuit adds the N sums by computing a weighted average.

13. The apparatus of claim 10, wherein the frequency estimation circuit adds the N sums using linear regression.

14. The apparatus of claim 10, wherein the frequency estimation circuit compensates for phase variations in the detected frequency synchronization signal.

15. The apparatus of claim 10, wherein the frequency estimation circuit performs phase unwrapping by adding the N sums.

16. The apparatus of claim 10, further comprising a quality factor estimating circuit for determining accuracy of the estimated frequency offset.

17. The apparatus of claim 16, wherein the quality factor estimating circuit comprises:

N subtractors for computing N differences, each a difference between one of the N sums of the M accumulated phase differences and the estimated frequency offset;

N circuits for computing the absolute values of the N differences; and an adder for adding the N absolute values to produce the estimated quality factor.

18. The apparatus of claim 17, wherein a signal received by the receiver is prefiltered.

19. The method of claim 1, wherein the frequency synchronization signal is a sinusoidal signal.

20. The apparatus of claim 10, wherein the frequency synchronization signal is a sinusoidal signal.

21. The method of claim 1, wherein M×N is the number of samples in the frequency synchronization signal.

22. The apparatus of claim 10, wherein M×N is the number of samples in the frequency synchronization signal.

23. The method of claim 1, wherein the communication system is a GSM system.

24. The apparatus of claim 10, wherein the communication system is a GSM system.

* * * * *